United States Patent
Zhong et al.

(10) Patent No.: US 12,446,478 B2
(45) Date of Patent: Oct. 14, 2025

(54) PHASE CHANGE MEMORY UNIT AND PREPARATION METHOD THEREFOR

(71) Applicant: SHANGHAI IC R&D CENTER CO., LTD., Shanghai (CN)

(72) Inventors: Min Zhong, Shanghai (CN); Gaoming Feng, Shanghai (CN)

(73) Assignee: SHANGHAI IC R&D CENTER CO., LTD., Shanghai (CN)

( * ) Notice: Subject to any disclaimer, the term of this patent is extended or adjusted under 35 U.S.C. 154(b) by 376 days.

(21) Appl. No.: 18/270,243

(22) PCT Filed: Dec. 24, 2021

(86) PCT No.: PCT/CN2021/141209
§ 371 (c)(1),
(2) Date: Jun. 29, 2023

(87) PCT Pub. No.: WO2022/143461
PCT Pub. Date: Jul. 7, 2022

(65) Prior Publication Data
US 2024/0065120 A1   Feb. 22, 2024

(30) Foreign Application Priority Data
Dec. 30, 2020  (CN) .......................... 202011608134.3

(51) Int. Cl.
*H10N 70/00* (2023.01)
*H10B 63/10* (2023.01)
*H10N 70/20* (2023.01)

(52) U.S. Cl.
CPC ......... *H10N 70/8413* (2023.02); *H10B 63/10* (2023.02); *H10N 70/066* (2023.02); *H10N 70/231* (2023.02); *H10N 70/8265* (2023.02)

(58) Field of Classification Search
CPC ............ H10N 70/8413; H10N 70/066; H10N 70/231; H10N 70/8265; H10N 70/861;
(Continued)

(56) References Cited

U.S. PATENT DOCUMENTS

| | | | |
|---|---|---|---|
| 7,679,163 B2 * | 3/2010 | Chen | ................... H10N 70/063 257/3 |
| 2003/0073295 A1 * | 4/2003 | Xu | ..................... G11C 13/0004 438/102 |

(Continued)

*Primary Examiner* — Allison Bernstein
(74) *Attorney, Agent, or Firm* — Bayramoglu Law Offices LLC

(57) ABSTRACT

The present invention is to provide a phase change memory unit and preparation method thereof. The phase change memory comprises a bottom electrode, a phase change cell, a heating electrode and a top electrode on a substrate from bottom to top. The phase change cell is a column vertically connected to the bottom electrode, which sequentially comprise a columnar phase change material layer, a hollow columnar heat dissipation layer and a hollow columnar switch layer from inside to outside. The top electrode, the heating electrode and the phase change material layer are connected sequentially from top to bottom, the switch layer is connected to the bottom electrode. The present invention adopts a heat dissipation layer wrapping around the phase change material layer to make the current density and the heat distribution more concentrated, thus to keep the effective phase transition region unchanged, reduce the volume of the effective phase transition region and the power consumption, and increase the device reliability.

9 Claims, 6 Drawing Sheets

(58) Field of Classification Search
CPC .. H10N 70/011; H10N 70/821; H10N 70/841; H10N 70/8613; H10B 63/10
See application file for complete search history.

(56) References Cited

U.S. PATENT DOCUMENTS

| | | | |
|---|---|---|---|
| 2004/0113232 A1* | 6/2004 | Johnson | H10N 70/821 257/529 |
| 2007/0164266 A1* | 7/2007 | Choi | H10N 70/8413 257/4 |
| 2008/0044632 A1* | 2/2008 | Liu | H10B 63/30 428/689 |
| 2008/0157053 A1* | 7/2008 | Lai | G11C 13/0004 257/4 |

* cited by examiner

PHASE CHANGE MEMORY UNIT AND PREPARATION METHOD THEREFOR

CROSS-REFERENCE TO RELATED APPLICATION

This application claims priority of International Patent Application Serial No. PCT/CN2021/141209, filed on Dec. 24, 2021, which is related to and claims priority of Chinese Patent Application Serial No. CN202011608134.3, filed on Dec. 30, 2020. The entirety of each of the above-mentioned patent applications is hereby incorporated herein by reference and made part of this specification.

TECHNICAL FIELD

The disclosure relates to the technical field of semiconductor integrated circuit manufacturing technology, in particular to a phase change memory unit and a preparation method thereof.

BACKGROUND

The Phase Change Memory (PCM for short) is an information storage device that stores data by utilizing the distinct electrical conductivities of particular materials between the crystalline state and the amorphous state. Specifically, the phase change memory usually utilizes a chalcogenide having the huge conductivity difference between the crystalline state and the amorphous state to store data.

FIG. 1 is a schematic diagram of a phase change memory unit in the prior art. As shown in FIG. 1, an existing phase change memory unit structure has a vertical stack structure of a phase change switch and a phase change resistor (1OTS+1R), which comprises a bottom electrode 01, a switch layer 02, a barrier layer 03, a phase change material layer 04 and a top electrode 05.

FIG. 2 is a schematic diagram illustrating an effective phase transition region of a phase change memory unit realized in the prior art. As shown in FIG. 2, for the phase change material layer 04, a semicircular region near an interface adjacent to the barrier layer is the effective phase transition region. The initial state of the phase change material layer 04 is crystalline. After a write operation, the effective phase transition region changes from the crystalline state to an amorphous state, while the other regions of the phase change material layer 04 remain crystalline. During the repeated read operations thereof, when $V_{ots}<V<V_{set}$ (V is a read operating voltage, $V_{ots}$ is the threshold voltage of the phase change switch, Vset is an erase operating voltage of the phase change resistor), heat continues to accumulate in the phase change material layer 04, which may cause phase change of the non-effective phase transition region and volume change of the effective phase transition region during the read operation, thus resulting in unstable phase change resistance and device reliability problems.

Therefore, a new type of a phase change memory unit structure is needed to solve the problem of volume change of the effective phase transition region in the phase change resistor, so as to improve the reliability.

SUMMARY

The purpose of the present invention is to overcome the above-mentioned defects existing in the prior art, and to provide a phase change memory unit and a preparation method thereof, so as to effectively improve the device performance and reliability of the phase change memory unit.

To achieve the above object, the technical scheme of the present invention is as follows:

a phase change memory unit, comprising from bottom to top: a bottom electrode, a phase change cell, a heating electrode and a top electrode which are formed on a substrate; wherein, the phase change cell is a column vertically connected to the bottom electrode, which sequentially comprise a columnar phase change material layer, a hollow columnar heat dissipation layer and a hollow columnar switch layer from inside to outside; the top electrode, the heating electrode and the phase change material layer are connected sequentially from top to bottom, and the switch layer is connected to the bottom electrode, wherein a cross-section of the phase change cell is one or more combinations of a circle, an ellipse, a rectangle, a rhombus and a polygon.

Further, the heating electrode is connected to a contact surface of the phase change material layer, the heat dissipation layer wraps around the remaining contact surfaces of the phase change material layer. The heating electrode is longitudinally arranged on a top surface of the phase change material layer, having a bottom arranged within an area of the top surface of the phase change material layer and a top connected to a lower end of the top electrode.

Further, an initial state of the phase change material layer is crystalline; the material of the phase change material layer comprises at least one of GeTe—$Sb_2Te_3$, GeTe—SnTe, $Sb_2Te$, $In_3SbTe_2$, Sb-based material, and GeTe—$Sb_2Te_3$, GeTe—SnTe, $Sb_2Te$, $In_3SbTe_2$ and Sb-based material which are doped with Sc, Ag, $In_2$, Al, In, C, S, Se, N, Cu, W elements.

Further, a cross-section of the heating electrode comprises one or more combinations of a ring, a circle, an ellipse, a rectangle, a rhombus and a polygon.

Further, thermal conductivity of the material of the heat dissipation layer is greater than 100 W/mK.

Further, a switch formed by the switch layer is one of a two-dimensional material transistor, an ovonic threshold switch and a metal oxide thin film resistance switch.

Further, the material of the heat dissipation layer comprises at least one of graphene, carbon-containing compounds, two-dimensional materials, Ti, W, Ta, Cu, WCN, WN and TaN.

To achieve the above object, the technical solution of the present invention is as follows:

a method for preparing a phase change memory unit, comprising: S1:

providing a substrate, depositing a first dielectric layer on the substrate, and forming a bottom electrode in the substrate and the first dielectric layer; S2: depositing a second dielectric layer on the first dielectric layer, forming a first trench or via in the second dielectric layer on the bottom electrode, the first trench or via penetrating the second dielectric layer; S3: forming a hollow columnar switch layer, a hollow columnar heat dissipation layer and a columnar phase change material layer sequentially on the second dielectric layer to fill the first trench or via; S4: removing the switch layer, the heat dissipation layer and the phase change material layer on the second dielectric layer by chemical mechanical polishing to form a phase change cell in the second dielectric layer; S5: depositing a third dielectric layer on the second dielectric layer, and forming a heating electrode connected to the phase change material layer in the third dielectric layer; S6: depositing a fourth dielectric layer on the third dielectric layer, and forming a top electrode connected to the heating electrode in the fourth dielectric layer; wherein, the top electrode, the heating electrode and the phase change material layer are connected sequentially from top to bottom, the switch layer is connected to the bottom electrode; wherein a cross-section of the phase change cell is one or more combinations of a circle, an ellipse, a rectangle, a rhombus and a polygon.

Further, in step S2, a horizontal dimension of the first trench or via is less than or equal to a horizontal dimension of a top surface of the bottom electrode; in step S5, a horizontal dimension of the heating electrode is less than a horizontal dimension of a top surface of the phase change material layer.

It can be seen from the above technical solution that the present invention adopts a heat dissipation layer wrapping around the phase change material layer to make the current density and the heat distribution more concentrated, thus to keep the effective phase transition region unchanged. The heat dissipation layer wrapping around the phase change material layer also reduces the effective phase transition region of the phase change material layer and decreases the device power consumption. Meanwhile, the contact area between the heat dissipation layer and the non-effective phase transition region of the phase change material layer is increased, the heat accumulation in the non-effective phase transition operating region is reduced, which decreases the possibility of the conversion from the non-effective phase transition region into the effective phase transition region, and increases the device reliability.

DETAILED DESCRIPTION

Figure 1:
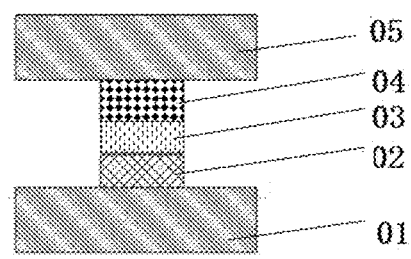
FIG. 1 is a schematic cross-sectional view of a phase change memory unit in the prior art.
Figure 2:
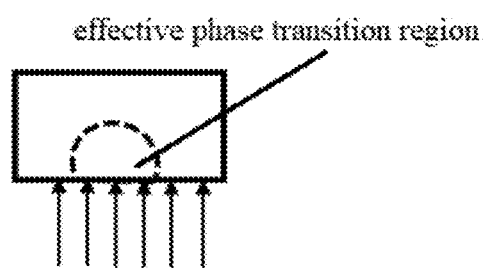
FIG. 2 is a schematic diagram illustrating an effective phase transition region of a phase change memory unit in the prior art.

The specific embodiments of the present invention will be further described in detail below with reference to the accompanying drawing FIG. 3-FIG. 11.

FIG. 4-FIG. 9 are schematic cross-sectional views of a product corresponding to a preparation method of a phase change memory unit according to an embodiment of the present invention. As shown in FIG. 4-9, the phase change memory unit is formed on a substrate 101. One or more dielectric layers are formed on the substrate 101, for example, the one or more dielectric layers comprise a first dielectric layer 102, a second dielectric layer 104, a third dielectric layer 110 and a fourth dielectric layer 112. The phase change memory unit is embedded in the one or more dielectric layers.

Specifically, the phase change memory unit comprises a bottom electrode 103, a phase change cell 109, a heating electrode 111 and a top electrode 113 on the substrate from bottom to top. The phase change cell 109 is a column vertically connected to the bottom electrode 103, which sequentially comprises a columnar phase change material layer 108, a hollow columnar heat dissipation layer 107 and a hollow columnar switch layer 106 from inside to outside; the top electrode 113, the heating electrode 111 and the phase change material layer 108 are connected sequentially from top to bottom, and the switch layer 106 is connected to the bottom electrode 103, wherein a cross-section of the phase change cell 109 is one or more combinations of a circle, an ellipse, a rectangle, a rhombus and a polygon, etc. In addition, cross-sections of the heat dissipation layer 107 and the switch layer 106 can be one or more combinations of a circular ring, an elliptical ring, a rectangular ring, a rhombus ring or a polygonal ring, etc.

The substrate 101 can be a semiconductor substrate, such as a silicon substrate, a gallium arsenide substrate, a germanium substrate, a silicon germanium substrate or a fully depleted silicon-on-insulator (FDSOI) substrate. The substrate 101 can also be an integrated circuit chip, that is, it can be an integrated circuit comprising gating transistors such as transistors and diodes.

Figure 4:
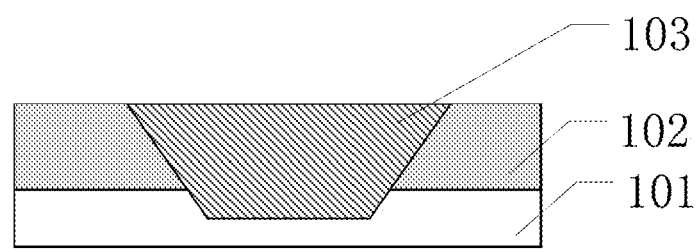
FIG. 4-FIG. 9 are schematic cross-sectional views of a product corresponding to a preparation method of a phase change memory unit according to an embodiment of the present invention.

Specifically, the bottom electrode 103 can be formed both in the substrate 101 and the first dielectric layer 102. For example, a lower part of the bottom electrode 103 is formed in the substrate 101, and an upper part of the bottom electrode 103 protrudes the surface of the substrate 101 and is formed in the first dielectric layer 102. The bottom electrode 103 can be a columnar structure, such as a truncated cone as shown in FIG. 4. The bottom electrode 103 can be a tungsten electrode, but is not limited thereto.

In an embodiment of the present invention, the heating electrode 111 is connected to a contact surface of the phase change material layer 108, the heat dissipation layer 107 wraps around the remaining contact surfaces of the phase change material layer 108. Preferably, a bottom of the heating electrode 111 is arranged within an area of the top surface of the phase change material layer 108, and a top of the heating electrode 111 is connected to a lower end of the top electrode 113.

Preferably, the heating electrode 111 is a columnar or via structure arranged longitudinally on the phase change material layer and connected to the lower end of the top electrode, a horizontal dimension of the heating electrode is less than a horizontal dimension of a top surface of the phase change material layer, and a horizontal dimension of the phase change cell 109 is less than or equal to a horizontal dimension of a top surface of the bottom electrode 103.

The material of the heat dissipation layer can be selected from a material having stable chemical properties. For example, the material has the chemical properties that material components will not be diffused after being annealed at 600° C. for 5 minutes. Further, the heat dissipation layer has good thermal conductivity. Preferably, the thermal conductivity is greater than 100 W/mK. The material of the heat dissipation layer 107 can be at least one of graphene, carbon-containing compounds, two-dimensional materials, Ti, W, Ta, Cu, WCN, WN and TaN.

Further, the switch formed by the switch layer can comprise one of a two-dimensional material transistor, an ovonic threshold switch (OTS) and a metal oxide thin film resistance ($MO_x$) switch. Meanwhile, the material of the heat dissipation layer will not cause resistance change or phase change during an operation of the phase change memory unit.

In an embodiment of the present invention, the initial state of the phase change material layer 108 can be a crystalline state. The material of the phase change material layer 108 comprises at least one of GeTe—$Sb_2Te_3$, GeTe—SnTe, $Sb_2Te$, $In_3SbTe_2$, Sb-based material, and GeTe—$Sb_2Te_3$, GeTe—SnTe, $Sb_2Te$, $In_3SbTe_2$ and Sb-based material which are doped with Sc, Ag, $In_2$, Al, In, C, S, Se, N, Cu, W elements.

Figure 3:
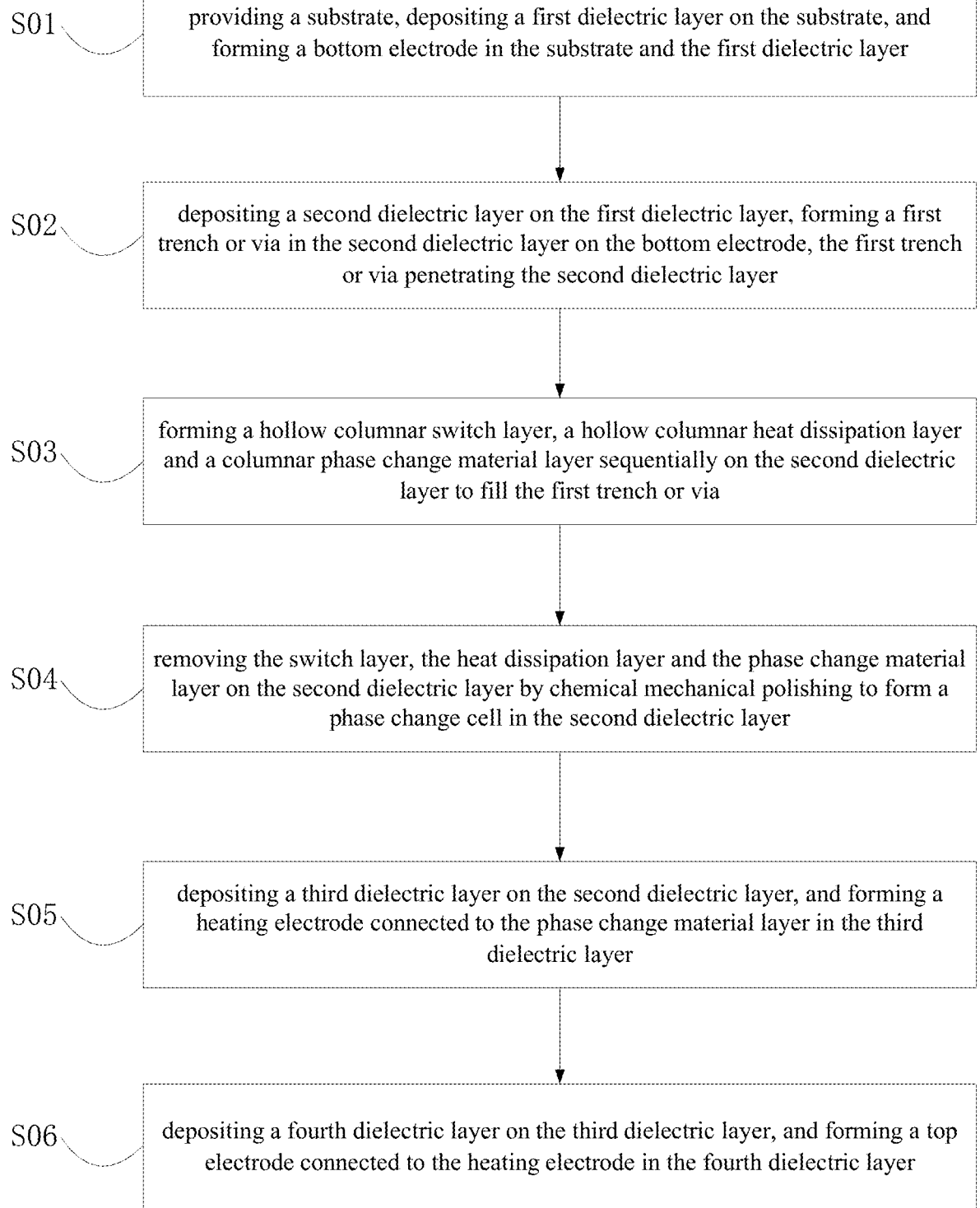
FIG. 3 is a schematic flow chart of a preparation method of a phase change memory unit according to an embodiment of the present invention.

FIG. 3 is a schematic flow chart of a preparation method of a phase change memory unit according to an embodiment of the present invention. As shown in FIG. 3, the preparation method of a phase change memory unit of the present invention comprises:

S1: depositing a first dielectric layer 102 on the substrate 101, and forming a bottom electrode 103 in the substrate 101 and the first dielectric layer 102. In this embodiment, the bottom electrode 103 is a truncated cone-shaped electrode with a larger top and a smaller bottom (as shown in FIG. 4). Wherein, the lower half of the bottom electrode 103 can be formed in the substrate 101, and the upper half of the bottom electrode 103 can be formed in the first dielectric layer 102.

Figure 5:
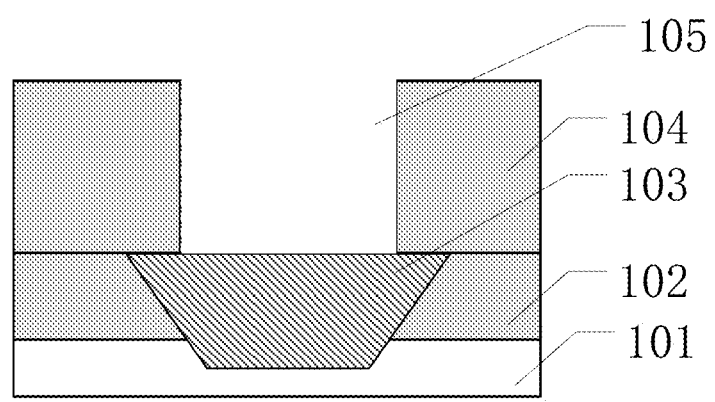

S2: depositing a second dielectric layer 104 on the first dielectric layer 102, forming a first trench or via 105 on the bottom electrode 103, the first trench or via 105 penetrating the second dielectric layer 104 (as shown in FIG. 5).

Viewed from a top view, the first trench or via 105 can be one of a circle, an ellipse, a rectangle, a rhombus and a polygon. In this embodiment, a cylindrical first via 105 is formed in the second dielectric layer 104. Wherein, the diameter of the first via 105 is smaller than the horizontal dimension of the top surface (adjacent to the first via 105) of the bottom electrode 103.

Figure 6:
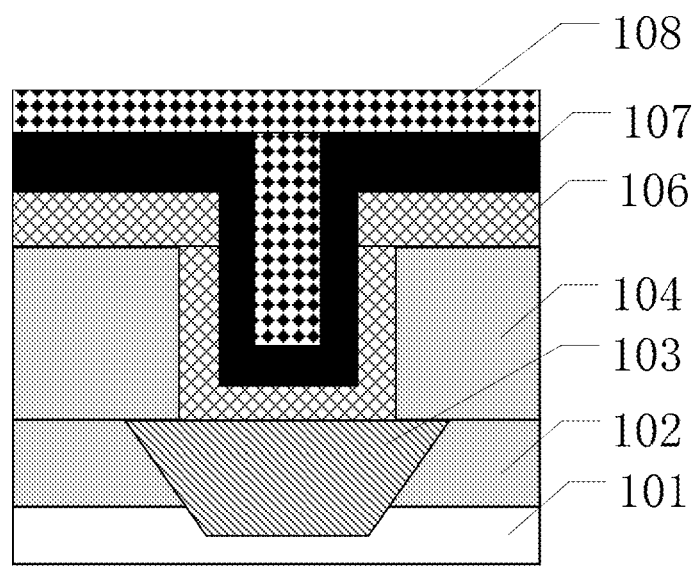

S3: forming a hollow columnar switch layer 106, a hollow columnar heat dissipation layer 107 and a phase change material layer 108 sequentially on the second dielectric layer 104 to fill the first trench or via 105. The switch layer 106 is connected to the bottom electrode 103. The phase change material 108 fills up the first trench or via 105 (as shown in FIG. 6).

In this embodiment, the material of the switch layer 106 can be $GeSeAs_2$, which is a phase change material that can form an ovonic threshold switch. A $GeSeAs_2$ film is formed by chemical vapor deposition and is amorphous. During an operation of the phase change material layer 108, the $GeSeAs_2$ film can be used as a gating device whose phase state does not change.

The material of the heat dissipation layer 107 is conductive with stable chemical properties, and will not cause element diffusion or chemical reaction with the material of the switch layer 106 and the material of the phase change material layer 108 at high temperature (600° C.). The heat dissipation layer wraps around the phase change material layer, which makes the current density and heat distribution more concentrated, so as to keep the effective phase transition region unchanged. Preferably, the material of the heat dissipation layer 107 is TaN.

The phase change material layer 108 can be formed by high-density plasma chemical vapor deposition (HDP CVD) at a deposition temperature of 200-500° C., and the phase change material 108 after deposition is in a crystalline state.

In order to obtain a good interface between the three films, the deposition processes can be performed in the same equipment.

Figure 7:
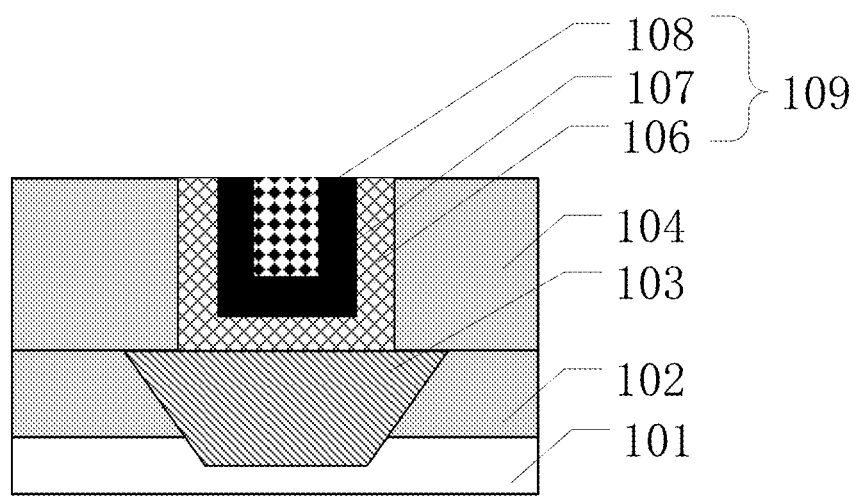

S4: removing the switch layer 106, the heat dissipation layer 107 and the phase change material layer 108 on the second dielectric layer 104 by chemical mechanical polishing (CMP), so as to form a phase change cell 109 in the second dielectric layer 104 (as shown in FIG. 7).

Figure 8:
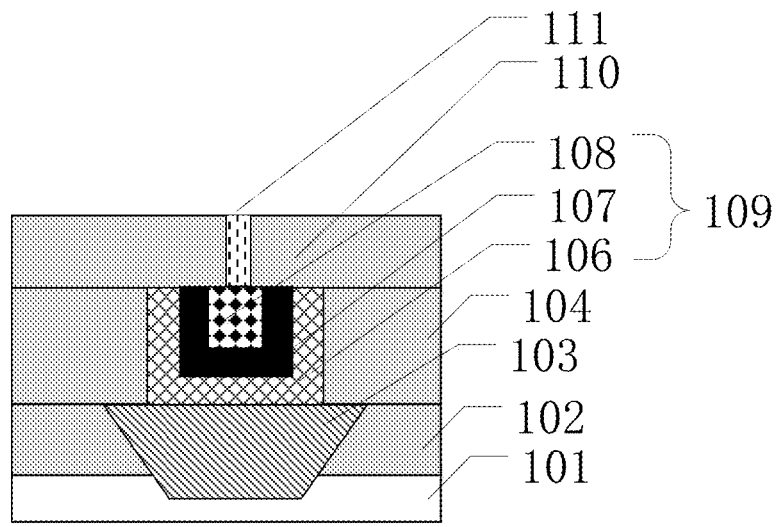

S5: depositing a third dielectric layer 110 on the second dielectric layer 104, and forming a heating electrode 111 connected to the phase change material layer in the third dielectric layer 110 (as shown in FIG. 8).

Figure 9:
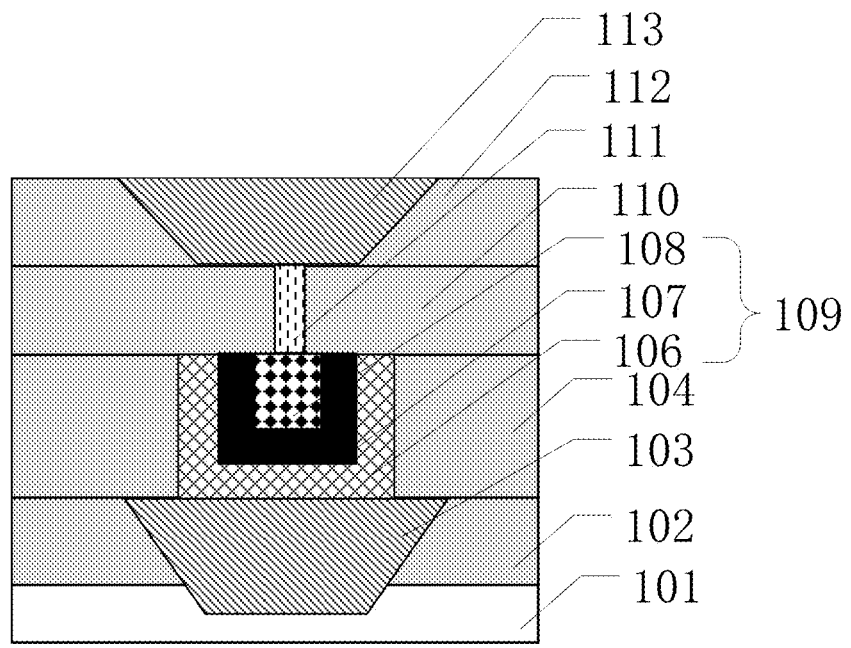

S6: depositing a fourth dielectric layer 112 on the third dielectric layer 110, and forming a top electrode 113 connected to the heating electrode in the fourth dielectric layer (as shown in FIG. 9).

In the above method, the trench or via filling and chemical mechanical polishing processes are used so as to prepare the phase change cell with a three-dimensional columnar nesting structure comprising a switch and a phase change resistor.

Figure 10:
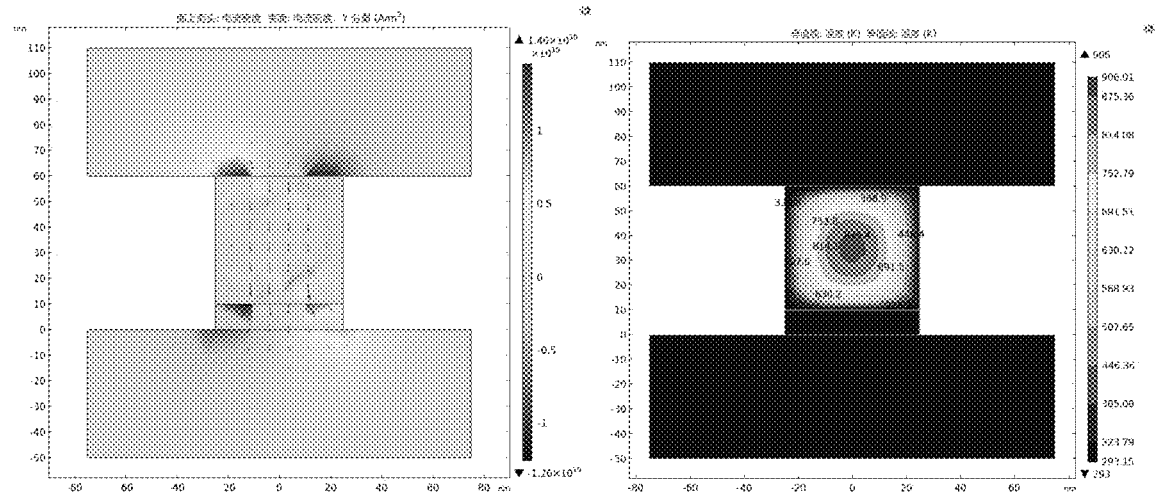
FIG. 10 is a schematic diagram of a simulation result of current density and heat distribution of a phase change memory unit in the prior art.
Figure 11:
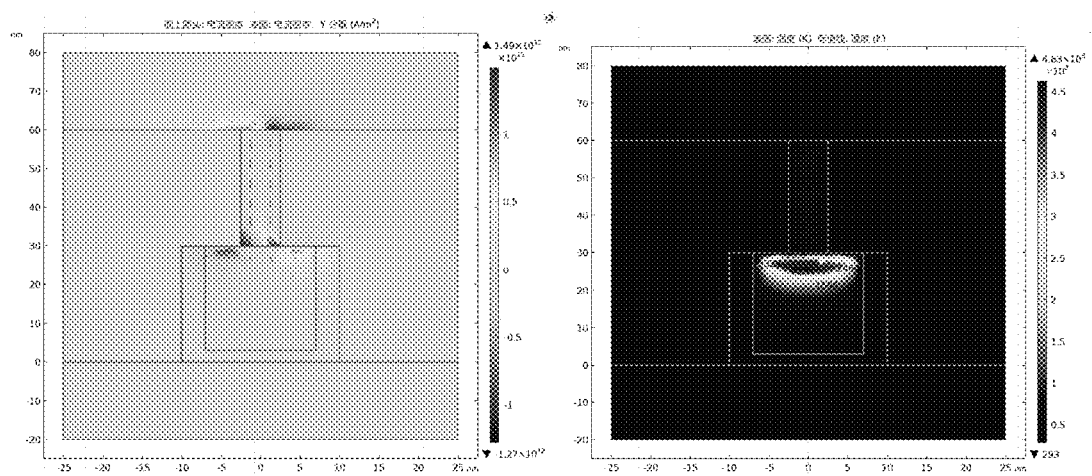
FIG. 11 is a schematic diagram of a simulation result of current density and heat distribution of a phase change memory unit according to an embodiment of the present invention.

FIG. 10 is a schematic diagram of a simulation result of current density and heat distribution of a phase change memory unit in the prior art. FIG. 11 is a schematic diagram of a simulation result of current density and heat distribution of a phase change memory unit in an embodiment of the present invention.

In this embodiment, the heating electrode is connected to a contact surface of the phase change material layer, the remaining contact surfaces of the phase change material layer are wrapped around by the heat dissipation layer, thus the effective phase transition region of the phase change material layer is adjacent to the contact surface connected to the heating electrode (as shown in FIG. 11). Compared with the existing phase change memory unit (as shown in FIG. 10), the current density and heat distribution are more concentrated, thus the effective phase transition region keeps unchanged. The wrapping by the heat dissipation layer also reduces the effective phase transition region of the phase change material layer, so as to reduce the power consumption. Meanwhile, the contact area between the heat dissipation layer and non-effective phase transition region of the phase change material layer is increased, the heat accumulation in the non-effective phase transition region is reduced, which decreases the possibility of the conversion between the non-effective phase transition region and the effective phase transition region, and increases the device reliability.

In addition, the phase change cell is formed by filling and polishing processes, which can effectively avoid horizontal dimension reduction of the phase change cell and device reliability problems due to the damages to the sidewalls of the phase change cell caused by etching. The heat dissipation layer has stable chemical properties and good thermal conductivity, and will not affect the device performance of the phase change cell.

The above are only the preferred embodiments of the present invention, and the embodiments are not intended to limit the scope of patent protection of the present invention. Therefore, any equivalent structural changes made by using the contents of the description and drawings of the present invention shall also comprise within the protection scope of the present invention.

What is claimed is:

1. A phase change memory unit, comprising from bottom to top: a bottom electrode, a phase change cell, a heating electrode and a top electrode which are formed on a substrate; wherein, the phase change cell is a column vertically connected to the bottom electrode, which sequentially comprises a columnar phase change material layer, a hollow columnar heat dissipation layer and a hollow columnar switch layer from inside to outside; the top electrode, the heating electrode and the phase change material layer are connected sequentially from top to bottom, and the switch layer is connected to the bottom electrode, wherein a cross-section of the phase change cell is one or more combinations of a circle, an ellipse, a rectangle, a rhombus and a polygon.

2. The phase change memory unit of claim 1, wherein the heating electrode is connected to a contact surface of the phase change material layer, the heat dissipation layer wraps around the remaining contact surfaces of the phase change material layer; the heating electrode is longitudinally arranged on a top surface of the phase change material layer, having a bottom arranged within an area of the top surface of the phase change material layer and a top connected to a lower end of the top electrode.

3. The phase change memory unit of claim 1, wherein an initial state of the phase change material layer is crystalline; material of the phase change material layer comprises at least one of $GeTe$—$Sb_2Te_3$, $GeTe$—$SnTe$, $Sb_2Te$, $In_3SbTe_2$, Sb-based material, and $GeTe$—$Sb_2Te_3$, $GeTe$—$SnTe$, $Sb_2Te$, $In_3SbTe_2$ and Sb-based material which are doped with Sc, Ag, $In_2$, Al, In, C, S, Se, N, Cu, W elements.

4. The phase change memory unit of claim 1, wherein a cross-section of the heating electrode comprises one or more combinations of a ring, a circle, an ellipse, a rectangle, a rhombus and a polygon.

5. The phase change memory unit of claim 1, wherein thermal conductivity of the material of the heat dissipation layer is greater than 100 W/mK.

6. The phase change memory unit of claim 1, wherein a switch formed by the switch layer is one of a two-dimensional material transistor, an ovonic threshold switch and a metal oxide thin film resistance switch.

7. The phase change memory unit of claim 1, wherein material of the heat dissipation layer comprises at least one of graphene, carbon-containing compounds, two-dimensional materials, Ti, W, Ta, Cu, WCN, WN and TaN.

8. A method for preparing a phase change memory unit, comprising:
   S1: providing a substrate, depositing a first dielectric layer on the substrate, and forming a bottom electrode in the substrate and the first dielectric layer;
   S2: depositing a second dielectric layer on the first dielectric layer, forming a first trench or via in the second dielectric layer on the bottom electrode, the first trench or via penetrating the second dielectric layer;
   S3: forming a hollow columnar switch layer, a hollow columnar heat dissipation layer and a columnar phase change material layer sequentially on the second dielectric layer to fill the first trench or via;
   S4: removing the switch layer, the heat dissipation layer and the phase change material layer on the second dielectric layer by chemical mechanical polishing to form a phase change cell in the second dielectric layer;
   S5: depositing a third dielectric layer on the second dielectric layer, and forming a heating electrode connected to the phase change material layer in the third dielectric layer;
   S6: depositing a fourth dielectric layer on the third dielectric layer, and forming a top electrode connected to the heating electrode in the fourth dielectric layer; wherein, the top electrode, the heating electrode and the phase change material layer are connected sequentially from top to bottom, the switch layer is connected to the bottom electrode;
   wherein a cross-section of the phase change cell is one or more combinations of a circle, an ellipse, a rectangle, a rhombus and a polygon.

9. The method of claim 8, wherein in step S2, a horizontal dimension of the first trench or via is less than or equal to a horizontal dimension of a top surface of the bottom electrode; in step S5, a horizontal dimension of the heating electrode is less than a horizontal dimension of a top surface of the phase change material layer.

* * * * *